(12) United States Patent
Sandstrom et al.

(10) Patent No.: US 11,143,953 B2
(45) Date of Patent: Oct. 12, 2021

(54) PROTECTION OF PHOTOMASKS FROM 193NM RADIATION DAMAGE USING THIN COATINGS OF ALD AL2O3

(71) Applicant: International Business Machines Corporation, Armonk, NY (US)

(72) Inventors: Robert L. Sandstrom, Chestnut Ridge, NY (US); Peter H. Bartlau, Essex Junction, VT (US); Thomas B. Faure, Milton, VT (US); Supratik Guha, Chicago, IL (US); Edward W. Kiewra, Underhill, VT (US); Louis M. Kindt, Underhill, VT (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 114 days.

(21) Appl. No.: 16/361,076

(22) Filed: Mar. 21, 2019

(65) Prior Publication Data
US 2020/0301270 A1 Sep. 24, 2020

(51) Int. Cl.
*G03F 1/68* (2012.01)
(52) U.S. Cl.
CPC ..................... *G03F 1/68* (2013.01)
(58) Field of Classification Search
CPC ..................... G03F 1/68; G03F 1/48
See application file for complete search history.

(56) References Cited

U.S. PATENT DOCUMENTS

| | | | |
|---|---|---|---|
| 3,341,753 | A | 9/1967 | Cunningham et al. |
| 3,960,560 | A | 6/1976 | Sato |
| 3,997,411 | A | 12/1976 | Muenz |
| 4,113,486 | A | 9/1978 | Sato |
| 4,283,485 | A | 8/1981 | Muenz et al. |
| 4,440,841 | A | 4/1984 | Tabuchi |
| 5,472,811 | A | 12/1995 | Vasudev et al. |
| 6,466,365 | B1 | 10/2002 | Maier et al. |
| 6,803,160 | B2 | 10/2004 | Johnstone et al. |
| 6,872,479 | B2 | 3/2005 | Maier et al. |
| 7,094,505 | B2 | 8/2006 | Zhang et al. |
| 7,242,843 | B2 | 7/2007 | Clar et al. |

(Continued)

FOREIGN PATENT DOCUMENTS

| | | |
|---|---|---|
| EP | 0005739 A1 | 12/1979 |
| EP | 0049799 | 11/1982 |

OTHER PUBLICATIONS

Puurunen, Riika, (Jun. 15, 2005) "Surface Chemistry of Atomic Layer Deposition: A case study for the trimediylaluminum/water process." Journal of Applied Physics. 97 (12): 121301. doi 10.1063/1.1940727. ISSN 0021-8979.

(Continued)

*Primary Examiner* — Stewart A Fraser
(74) *Attorney, Agent, or Firm* — Daniel Morris; Otterstedt, Wallace & Kammer, LLP

(57) ABSTRACT

The invention relates to a method used in a photolithographic process comprising depositing a film of Atomic Layered Deposition (ALD) $Al_2O_3$ on a photomask, subjecting said film of $Al_2O_3$ on the photomask to a plasma treatment and then irradiating the deposited film of ALD $Al_2O_3$ on the coated photomask at a wavelength of 193 nm.

19 Claims, 9 Drawing Sheets

(56) References Cited

U.S. PATENT DOCUMENTS

| | | | |
|---|---|---|---|
| 8,877,409 B2 | 11/2014 | Hsu et al. | |
| 2008/0044740 A1 | 2/2008 | Lin et al. | |
| 2013/0069246 A1 | 3/2013 | Bae et al. | |
| 2014/0335445 A1* | 11/2014 | Kang | G03F 1/68 430/5 |
| 2018/0321581 A1* | 11/2018 | Chou | H01L 21/0338 |

OTHER PUBLICATIONS

Miikkulainen, Ville; Leskaelä, Marku; Ritala, Mikko; Puurunen, Riikka L. (Jan. 14, 2013). "Crystallinity of Inorganic Films Grown by Atomic Layer Deposition Overview and General Trenda," Journal of Applied Physics. 113 (2) 021301. doi 10.1063/1.4757907. ISSN 0021-8979.

"How Atomic Layer Deposition Works" Applied Materials. https://www.youtube.com/watch?v=KOEsqZU1sts.

Hans-Jurgen Butt; Karlheinz Graf; Michale Kappl (2013). Physics and Chemistry of Interfaces (Third, Revised Ed.). ISBN 978-3-527-41216-7.

"2.3 Adsorption Kinetics—The Rate of Adsorption." www.chem.qmul.ac.uk.

George, S. M. (2010) "Atomic Layer Deposition: An overviw." Chem. Rev. 110: 111-131.

A. Ahnd, Semicond. Int. 26, 46-51, 2003.

Detlev Ristau et al., "Ion beam sputter coatings for laser technology," Proc. of SPIE, vol. 5963, 596313, 2005, abstract and excerpt 4 pages total.

\* cited by examiner

OMOG with no Al2O3
Shows significant CD change after irradiation

OMOG with 5nm ALD Al2O3 coating
No CD change after irradiation

COG with 1.1nm Al2O3
barely noticeable effect decorating feature edge

OMOG with 1.1nm Al2O3
overlayed images of irradiated and unirradiated
sites show no CD change Vigorous O2 ash may have opened up pinholes in 1.1nm Al2O3 film in "thin Cr Field".
- small effect at edges of Cr features, no effect within Cr features

PROTECTION OF PHOTOMASKS FROM 193NM RADIATION DAMAGE USING THIN COATINGS OF ALD AL2O3

BACKGROUND

The present invention relates to a photomask, the method of producing same and the materials used in conjunction with photo-lithographic processes.

It is known in the field of printed circuit fabrication or microelectronic fabrication, to use a photomask in forming images utilizing a photo resist method.

The photolithographic process uses a light sensitive polymer, called a photoresist, which is exposed to radiation and developed to form three-dimensional relief images on a silicon wafer layer substrate. The ideal photoresist image has the exact shape of the designed or intended pattern in the plane of the substrate, with vertical walls through the thickness of the resist.

The exposure step modifies the chemistry of the photoresist so that the exposed portion either dissolves in a so-called developer and washes away—(Positive resist), or solidifies and remains on the mask while all the unexposed resist washes away in the developer—(Negative resist).

Thus, the final resist pattern is binary: parts of the substrate are covered with resist while other parts are completely uncovered. This binary pattern is needed for pattern transfer since the parts of the substrate covered with resist will be protected from etching, ion implantation, or other pattern transfer mechanism.

A photomask, in combination with a photoresist, plays an essential role in the overall lithographic process. The general sequence of processing steps for a typical photolithography process includes the steps of substrate preparation, a photoresist spin coat, prebake, exposure, post-exposure bake, develop. A resist strip is the final operation in the lithographic process, after the resist pattern has been transferred into the underlying layer, typically by some sort of etch process. This sequence of steps is generally performed on several tools linked together into a contiguous unit called a lithographic cluster, controlled by a computer, processor, or processing circuit.

After the prebaking step in the sequence of processing steps noted above, the photoresist film is photosensitive and is ready to be exposed to the optical light source. A photomask, which contains a negative or positive replica of the desired pattern, depending on whether a negative or a positive photoresist (PR) layer is exposed to a UV light source such that the pattern is transferred to the soft baked PR coated film and is exposed to a UV light source.

One type of photomask is a Chrome on Glass (COG) mask. COG photomasks are generally chrome coated lithographic templates on pure silica glass (or quartz) designed to optically transfer patterns on to other substrates. The photomask is an essential hardware component in photolithography or any pattern replication method which uses optical means for transferring the structure. The desired pattern is "drawn" on the photo mask itself. If a topographic feature is generated on the photo resist layer, the lateral dimension of the features will depend on the patterns created on the mask, while the vertical dimension of the pattern will depend on the thickness of the PR layer. The pattern information on the mask is created in a drawing package and stored in a database, reformatted and transferred to a "writer", which can be a laser writer or e-beam writer.

The typical COG photomask if formed from a quartz glass piece which is fully coated with chromium. Chromium is opaque to UV light and does not allow any light to pass. Thus, when UV light is projected through the COG mask, the chromium absorbs the light in the non-etched opaque regions where the light passes through the quartz blank in the etch regions, forming the desired pattern on the PR coated film-chromium-coated glass piece is positioned on the PR coated film. This allows the light to fall only over the areas of the PR film following the contour of the patterns available on the photomask.

Fabrication of the photo mask therefore requires preferential removal of the chrome layer, which should correspond to the desired pattern or structure on the photo resist surface.

Oddly a photoresist layer is used to fabricate a photo mask. Normally, a positive photoresist is used while making a photomask, which is coated on the chrome coated quartz substrate. Typically, a laser beam or an electron beam is dispersed over this PR layer to generate the desired pattern. Since a positive PR is used, the exposed areas (areas over which the electron beam or the laser light has traveled) will wash away during development and will expose the chrome layer beneath it.

The exposed portion of the chromium layer is etched away by either a plasma or wet etch process, resulting in areas through which light can pass.

There was a time when scientists predicted the end of photolithography as a viable method of making faster and cheaper processors. Their thought was that it would not be possible to produce a structure smaller than one micrometer. As technology progressed, it required shorter wavelengths of light and more adroit techniques to achieve smaller elements.

For example, processors made in the 1970s through earlier methods used regular white light to produce processors on a scale of 10 micrometers. Currently, extreme ultra violet light is used for its smaller wavelength.

One photomask in use today is a so called blank. The resist is sensitive to electron beam bombardments and can be transferred into the chrome layer via etch processes. The chrome represents opaque areas on the photomask which are responsible for the casting of shadow during exposure of the silicon wafers.

Besides the traditional glass substrate which is coated with a chrome and a resist layer, i.e., chrome on glass mask (COG), there are various other types of photomasks which enhance the optical resolution of the structures. The central issue of COG masks is the diffraction of the light on edges. The light will not only impact in perpendicular direction but will be deflected into areas which must not be exposed.

Another photomask is the attenuated phase shift mask (AttPSM; called a half tone mask) which uses a patterned layer of molybdenum doped silicon oxynitride (MoSi) which represents the structures of the circuit. The MoSi has a thickness which causes a phase shift of the transmitted light of 180°. Thus, the phase shifted light and the radiation which transmits through glass only interfere destructively. In addition, the MoSi is dense (6% or 18% @ 193 nm wavelength). On the one hand the light is attenuated and on the other hand the light waves which are in opposite phase erase each other almost completely, resulting in a higher contrast.

A chrome layer can be added to areas which are not used for exposure to mask unused regions. These photomasks are named tritone masks.

A basic principle behind the operation of a photoresist is the change in solubility of the resist in a developer upon exposure to light (or other types of exposing radiation).

Contact and proximity lithography are the simplest methods of exposing a photoresist through a photomask master pattern.

Contact lithography offers high resolution (down to about the wavelength of the radiation), but practical problems such as photomask damage from this radiation bombardment and resulting low yield make this process unusable in most production manufacturing environments.

Proximity printing reduces photomask damage by keeping the mask a set distance above the wafer (e.g., 20 μm above the actual surface). Unfortunately, the resolution limit is increased to greater than 2 to 4 μm, making proximity printing insufficient for today's technology, by far the most common method of exposure is projection printing.

Projection lithography derives its name from the fact that an image of the photomask is projected onto the wafer. Projection lithography became a viable alternative to contact/proximity printing in the mid-1970s when the advent of computer-aided lens design and improved optical materials allowed the production of lens elements of sufficient quality to meet the requirements of the semiconductor industry. In fact, these lenses have become so perfect that lens defects, called aberrations, play only a small role in determining the quality of the image. Such an optical system is said to be diffraction-limited, since it is diffraction effects and not lens aberrations which, for the most part, determine the shape of the image.

An important feature that must be considered in a photolithographic process is "Resolution." Resolution is the smallest feature that can be printed with adequate control, and has two basic limits: the smallest image that can be projected onto the wafer, and the resolving capability of the photoresist to make use of that image. From the projection imaging side, resolution is determined by the wavelength of the imaging light ($\lambda$) and the numerical aperture (NA) of the projection lens according to the Rayleigh criterion:

$$R \approx \lambda/NA$$

Lithography systems have progressed from blue wavelengths (436 nm) to UV (365 nm) to deep-UV (248 nm) to today's mainstream high-resolution wavelength of 193 nm.

In the meantime, projection tool numerical apertures have risen from 0.16 for the first scanners to amazingly high 0.93 NA systems today producing features well under 100 nm in size.

Before the exposure of the photoresist with an image of the mask can begin, this image must be aligned with the previously defined patterns on the wafer. This alignment, and the resulting overlay of the two or more lithographic patterns, is critical since tighter overlay control means circuit features can be packed closer together. Closer packing of devices through better alignment and overlay is nearly as critical as smaller devices through higher resolution in the drive towards more functionality per chip.

Another important aspect of photoresist exposure is the standing wave effect. Monochromatic light, when projected onto a wafer, strikes the photoresist surface over a range of angles, approximating plane waves. The aforementioned monochromatic light travels down through the photoresist and, if the substrate is reflective, is reflected back up through the resist. The incoming and reflected light interfere to form a standing wave pattern of high and low light intensity at different depths in the photoresist. This pattern is replicated in the photoresist, causing ridges in the sidewalls of the resist feature. As pattern dimensions become smaller, these ridges can significantly affect the quality of the feature. The interference that causes standing waves also results in a phenomenon called swing curves, the sinusoidal variation in linewidth with changing resist thickness. These detrimental effects are best cured by coating the substrate with a thin absorbing layer called a bottom antireflective coating (BARC) that can reduce the reflectivity seen by the photoresist to less than 1 percent.

Photomask materials of the type described above degrade when exposed to 193 nm light in lithographic tools. As an example, MoSi oxidizes and chromium-based materials undergo chromium migration. In both cases the degradation results in an unacceptable change in the size of the features on the mask. Once this degradation occurs, the mask must be discarded. In addition, since the degradation occurs continuously with use, the degradation is progressive—resulting in changing performance of the mask during its useful life and posing the problem of fabrication of faulty integrated circuits.

SUMMARY

The present invention relates to a method used in a photolithographic process comprising depositing a film of Atomic Layered Deposition (ALD) $Al_2O_3$ on a photomask, subjecting said film of $Al_2O_3$ on the photomask to a plasma treatment and then irradiating the deposited film of ALD $Al_2O_3$ on the coated photomask at a wavelength of 193 nm.

The photomask of the present invention may comprise any photomask known in the art, but is preferably selected from the group consisting of chromium on glass (COG) and opaque molybdenum silicide on glass (OMOG). The photomask with the film layer of ALD $Al_2O_3$ deposited thereon is subjected to a plasma treatment, preferably, oxygen ashing.

The thickness of the ALD $Al_2O_3$ deposited on said photomask is between 0.5 nm and 6 nm, preferably between about 1.1 nm and about 5 nm for optimum results.

The irradiation treatment of the coated photomask can be optimally conducted in a dry air environment or in a 40% humidity environment.

The invention embodies a very thin layer of protective material. More specifically, an atomic layer deposition (ALD) of $Al_2O_3$, is deposited over the surface of a patterned photomask which serves to block induced chemical degradation resulting from the exposure of the coated photomask to a 193 nm wave-length. By virtue of the atomic layer deposition (ALD) of a thin film of $Al_2O_3$ on a COG photomask or an OMOG photomask, the aforementioned photomasks are protected from degradation when exposed to the 193 nm wave length during the course of a photolithographic process.

The invention further relates to a computer program product for depositing an ALD film of $Al_2O_3$ on a photomask. The computer program product comprises a computer readable storage medium having stored thereon: a first program instructions executable by a processing circuit device to cause the device to deposit a film of ALD $Al_2O_3$ on said photomask using an atomic deposition method.

The second program instruction which is executable by a processing circuit device caused the device to subject the photomask with the film of ALD $Al_2O_3$ thereon to a plasma treatment.

The third program instructions executable by the processing circuit device causes irradiation of the film of ALD $Al_2O_3$ on said photomask at a wavelength of 193 nm.

DETAILED DESCRIPTION

Figure 1:
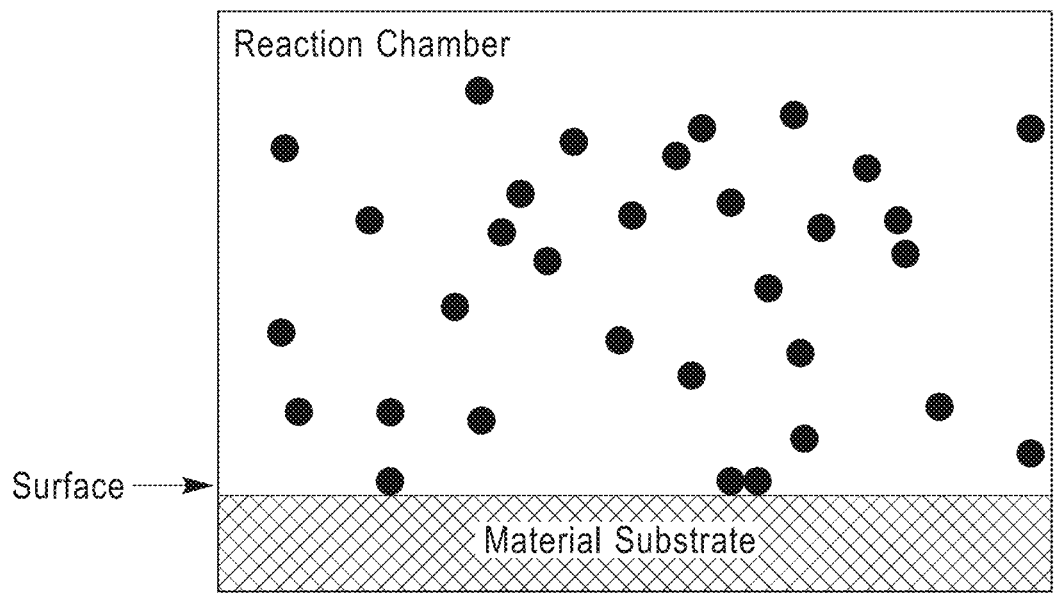
FIG. 1 is a schematic of an atomic layer deposition process wherein a first precursor is added to a reaction chamber containing a surface to be coated to form a layer.

The present invention relates to photolithography, also termed optical lithography or UV lithography, which is a process used in microfabrication to pattern parts of a thin film on the bulk of a substrate. It uses light to transfer a geometric pattern from a photomask to a light-sensitive chemical "photoresist", often referred to simply as a "resist," on the substrate.

More particularly, the present invention relates to a specific article, i.e., a photomask that is used in conjunction with the photolithography process. Photomasks used for optical lithography contain the pattern of the integrated circuits. The basis is a so called blank: a glass substrate which is coated with a chrome and a resist layer. The resist is sensitive to electron beams and can be transferred into the chrome layer via etch processes. The chrome represents opaque areas on the photomask which are responsible for the casting of shadow during exposure of the silicon wafers.

One suitable photomask is the quartz/glass (substrate) that has a layer of chrome on one side. The chrome is covered with an AR (anti-reflective) coating and a photosensitive resist. The photomask substrate with chrome, AR, and resist is known as a blank photomask.

Besides the traditional chrome on glass mask (COG) there are various types of photomasks which enhance the optical resolution of the structures. The central issue of COG masks is the diffraction of the light on edges. Thus, the light will not only impact in perpendicular direction but will be deflected into areas which must not be exposed.

There are different means which reduce the intensity of the diffracted light. The AttPSM uses a patterned layer of molybdenum silicide (MoSi) such as the OMOG, as used in the present invention, which represents the structures of the circuit. The molybdenum silicide is dense (6% or 18% at 193 nm wavelength). On the one hand the light is attenuated, and on the other hand, the light waves which are in opposite phase erase each other almost completely, this results in a higher contrast.

The present invention's use of the OMOG binary photomask material that employs MoSi as the absorber layer provides sufficient optical density to appear opaque at 193 nm wavelengths while simultaneously being thin enough to reduce the EMF effects that previously plagued high NA immersion lithography. Since the entire industry has decades of experience using MoSi films, OMOG is a perfect solution for advanced lithography.

The OMOG material has particular advantage as a result of the OMOG material stack utilizing a MoSi absorber with a higher extinction coefficient, which allows further reduction in the film thickness while maintaining sufficient optical density. Improved pattern fidelity and better resolution are achieved through the combination of a super thin chrome hard-mask and thinner resist. The MoSi absorber, with its high anisotropic etch behavior, helps deliver superior CD uniformity in the final product. Furthermore, the low film stress inherent to the OMOG film stack helps to improve flatness and reduce process-induced pattern placement errors. Thus, OMOG photomasks provide finer resolution, increased fidelity, tighter CD uniformity and better registration.

Chrome less phase shift masks don't use opaque films. The phase shift is achieved by trenches which are directly etched into the glass substrate. The manufacturing of these masks is difficult, since the etch approach has to be stopped in the middle of the glass. In contrast to etch processes where one layer is completely etched till the layer beneath is reached—which causes changes in the etch plasma, so that one knows when the process is finished—, there is no indication when the exact depth in the substrate is reached.

The alternating phase shift mask also uses trenches which are etched into the glass substrate alternating to non-etched areas. In addition, there are areas which are covered with a chrome layer to decrease the intensity of radiation in these regions. However, there are regions with an undefined phase shift, so that one has to exposure twice with different masks. One mask contains the structures which run in x-direction, while the second mask contains the patterns which are orientated in y-direction.

The evolution of lithography wavelength corresponds to different light sources. In lithography, wavelengths below 300 nm are called "deep ultraviolet (DUV) light". In order to achieve the most efficient way to achieve higher resolution, the present invention uses a light source having a 193 nm wavelength. Moving to wavelengths shorter than 193 nm presents problems.

The ability to project a clear image of a small feature onto the wafer is limited by the wavelength of the light that is used, and the ability of the reduction lens system to capture enough diffraction orders from the illuminated mask.

Both new and recycled bare photomasks may have a thin invisible layer of organic contamination on the Cr surface. This organic layer will sometimes cause adhesion problems between the Cr and the photoresist later in the process. It also may interfere with the Cr etch process after photomask imaging. Whatever contamination exists can be removed with a short, but aggressive oxygen plasma treatment (ashing) before starting the photomask process. Plasma ashing as used in the present invention, removes the photoresist from an etched wafer. Using a plasma source, a monatomic reactive species is generated. Oxygen or fluorine are the most common reactive species and are used in accordance with the present invention. The reactive species combines with the photoresist to form ash which is removed with a vacuum pump.

Atomic layer deposition (ALD) is a thin-film deposition technique based on the sequential use of a gas phase chemical process. ALD is considered a subclass of chemical vapor deposition. In the ALD thin-film deposition method a film grows on a substrate by exposing its surface to alternate gaseous species, typically referred to as precursors. These precursors react with the surface of a material one at a time in a sequential, self-limiting, manner. Through the repeated exposure to separate precursors, a thin film is slowly deposited.

In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.[1] By varying the number of cycles it is possible to grow materials uniformly and with high precision on arbitrarily complex and large substrates.

ALD is considered a one deposition method for producing very thin, conformal film allowing control of the thickness and composition of the films possible at the atomic level.

In the ideal ALD process one obtains extremely 'flat' surface behavior which is critical to focus on in photolithography radiation to keep surface in focus for resolution purposes and this is needed at the 193 nm wavelength.

In the ALD method used in the present invention, the thickness of the $Al_2O_3$ coating is between about 0.5 nm and about 6 nm, preferably between about 1.1 nm and 5 nm.

In contrast to chemical vapor deposition (CVD), the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. Consequently, the maximum amount of material deposited on the surface after a single exposure to all of the precursors (a so-called ALD cycle) is determined by the nature of the precursor-surface interaction.

In a prototypical ALD process, a substrate is exposed to two reactants A and B (See FIGS. 1 and 2) in a sequential, non-overlapping way. In contrast to other techniques such as chemical vapor deposition (CVD), where thin-film growth proceeds on a steady-state fashion, in ALD each reactant reacts with a surface in a self-limited way: the reactant molecules can react only with a finite number of reactive sites on the surface. Once all those sites have been consumed in the reactor, the growth stops. The remaining reactant molecules are flushed away and only then is reactant B charged into the reactor. By alternating exposures of A and B a thin film is deposited. Consequently, when describing the instant ALD process, one refers to both dose times (the time a surface is being exposed to a precursor) and purge times (the time left in between doses for the precursor to evacuate the chamber) for each precursor. The dose-purge-dose-purge sequence of a binary ALD process constitutes an ALD cycle. Also, rather than using the concept of growth rate, ALD processes are described in terms of their growth per cycle. In the ALD process, enough time is allowed in each reaction step so that a full adsorption density can be achieved. When this happens, the process has reached saturation. This time will depend on two key factors: the precursor pressure, and the sticking probability.

A basic schematic of the atomic layer deposition process is depicted in FIGS. 1 to 4.

Figure 2:
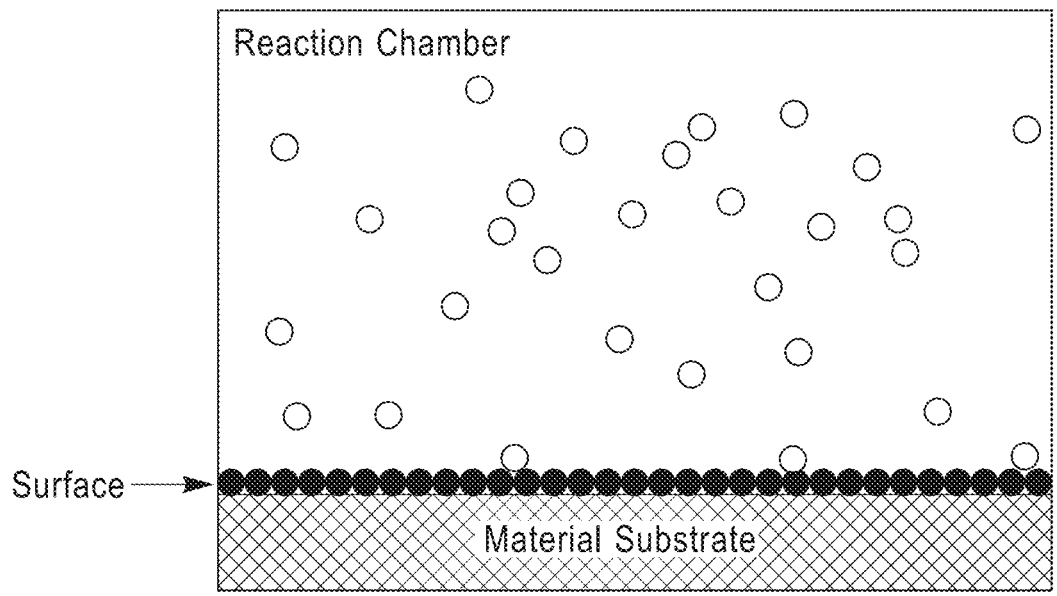
FIG. 2 is a schematic of an atomic layer deposition process wherein a second precursor is added to a reaction chamber to react with a first precursor to create another layer on the surface.
Figure 3:
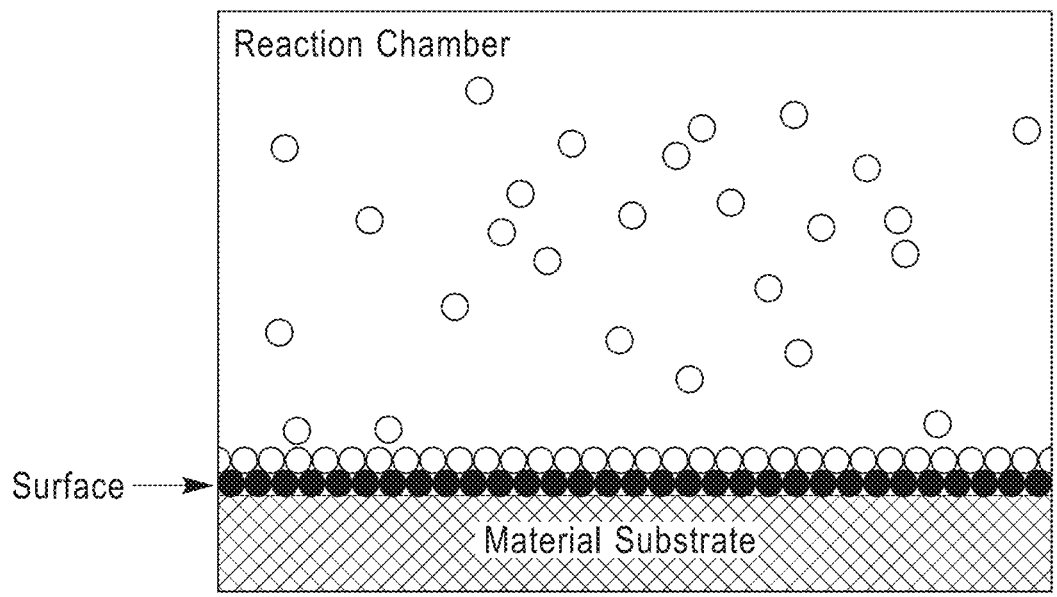
FIG. 3 is a schematic of an atomic layer deposition process wherein the second precursor reacts with the first precursor to form another layer on the surface.
Figure 4:
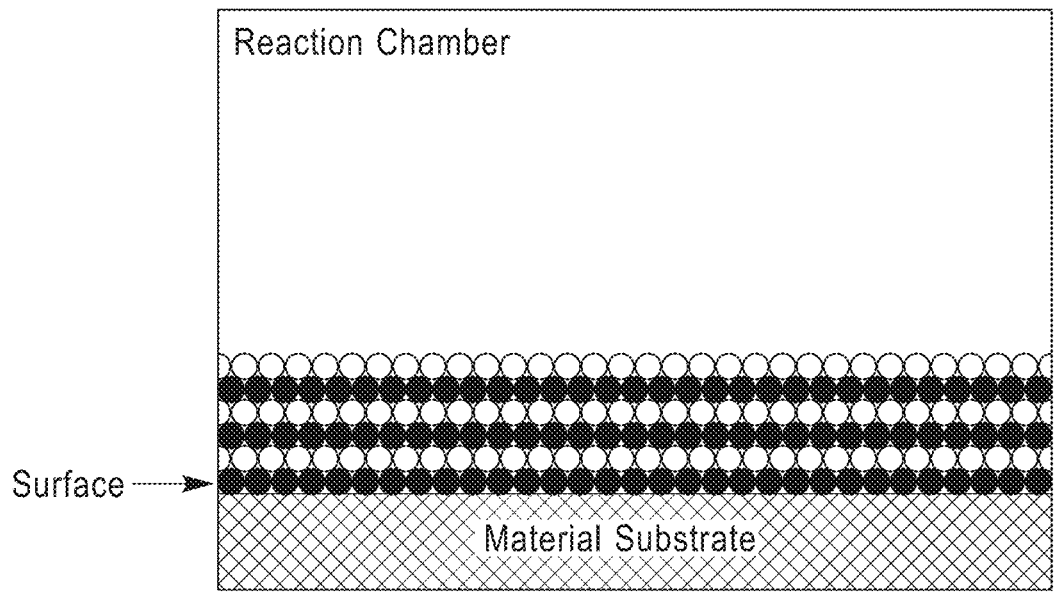
FIG. 4 is a schematic of an atomic layer deposition process wherein the first precursor and the second cursor form a desired thickness in the reaction chamber.

In FIG. 1, precursor 1 (represented by the solid circles) is added to the reaction chamber containing the material surface to be coated ALD. After precursor 1 has adsorbed on the surface, any excess is removed from the reaction chamber. In FIG. 2, precursor 2 (represented by the open circles) is added and reacts with precursor 1 to create another layer on substrate surface 3. In FIG. 3, precursor 2 is then cleared from the reaction chamber and this process is repeated until a desired thickness is achieved and the resulting product resembles the embodiment depicted in FIG. 4. Substrate 1 is conveniently MoSi (OMOG) and Chrome on Glass (COG).

The rate of adsorption per unit of surface area can be expressed as:

$$R \text{ adsorption} = S * F$$

Where R is the rate of 'adsorption', S is the 'sticking probability and F is the 'incident molar flux'.

A key characteristic of ALD is that S will change (ds/dt) with time, wherein, as more molecules have reacted with the surface, the sticking probability limit will approach zero once saturation is reached.

The synthesis of $Al_2O_3$ from trimethylaluminum (TMA) and water is one of the convenient sources of $Al_2O_3$ for use in the present invention. The self-limited growth of $Al_2O_3$ used in the method can be achieved in a wide range of temperatures ranging from room temperature to more than 300° C.

During the TMA exposure, TMA dissociatively chemisorbs on the substrate surface and any remaining TMA is pumped out of the chamber. The dissociative chemisorption of TMA leaves a surface covered with $AlCH_3$. The surface is then exposed to $H_2O$ vapor, which reacts with the surface —$CH_3$ forming $CH_4$ as a reaction byproduct and resulting on a hydroxylated $Al_2O_3$ surface.

The atomic layer deposition transport mechanism is shown as:

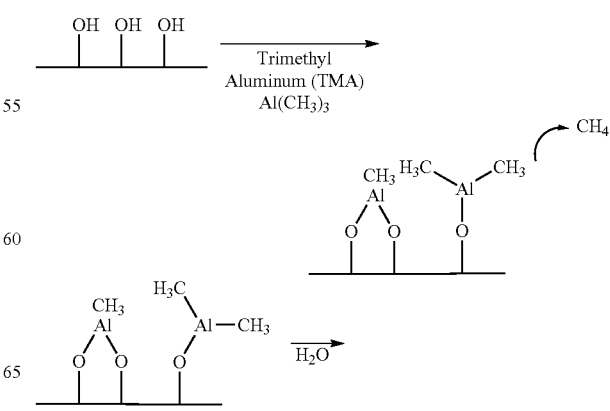

-continued

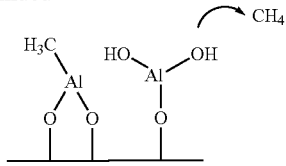

By varying the number of cycles, it is possible to grow materials very uniformly and with high precision (resolution) on arbitrarily simple, complex and large substrates.

ALD is one deposition method for producing very thin, conformal films with control of the thickness and composition of the films possible at the atomic level.

EXAMPLE

The following procedures were conducted to establish the superiority of the use of $Al_2O_3$ when applied by atomic layer deposition on patterned photomasks.

Two samples each of patterned Cr (COG) and MoSi (OMOG) photomasks were subjected to oxygen plasma ashing, using the plasma generating process described above.

Using atomic layer deposition (ALD), 5 nm of $Al_2O_3$ were deposited on samples of COG and OMOG. The 5 nm COG and OMOG exposed samples were exposed to 193 nm irradiation in dry air, followed by humid air irradiation. Photos of the 5 nm COG and OMOG samples were taken using a scanning electron microscope (SEM) producing images of the 5 nm samples resulting from the interactions of a focused beam of electrons with atoms at various depths within the samples. The resulting photos were compared with SEM photos taken of COG and OMOG samples containing no $Al_2O_3$ deposited thereon.

Meaningful information is obtained with respect to the surface topography and composition of the COG and OMOG samples by using the SEM photos that were taken of treated samples and non-treated samples that produced images of the respective samples by scanning their respective surfaces.

The SEM photos provided herein in FIGS. 5-12, serve to illustrate difference in kind, rather than difference in degree as to the effectiveness of the present invention embodiments by comparing the sample possessing an $Al_2O_3$ coating layer applied by ALD with a sample possessing with no $Al_2O_3$ coating.

Figure 5:
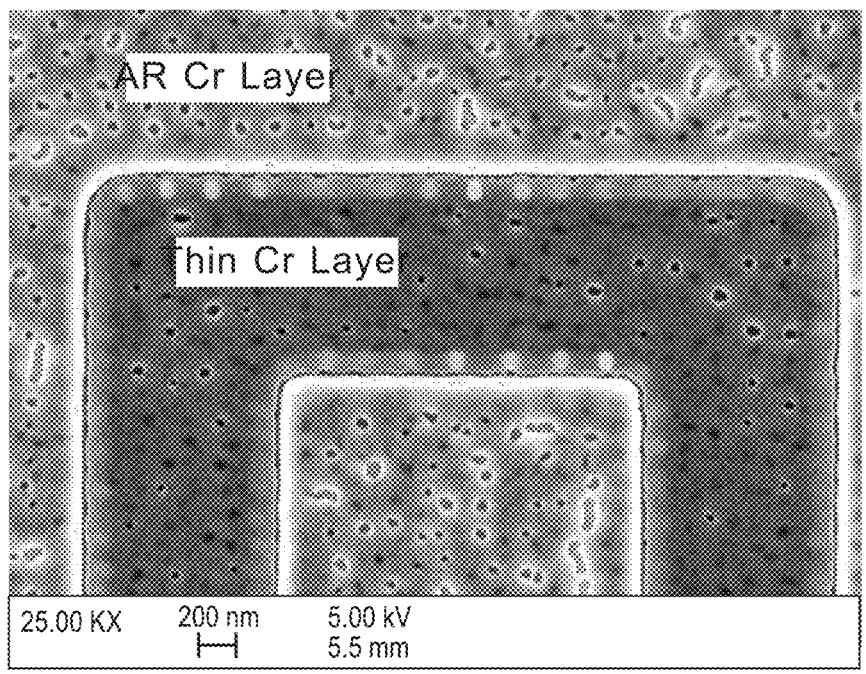
FIG. 5 is a SEM photo of COG with no ALD $Al_2O_3$ coating after irradiation.

FIG. 5 is a SEM photo of a COG sample that contains no $Al_2O_3$ after irradiation that depicts the AR Cr layer and the thin Cr layer. sample that was exposed to 193 nm irradiation in dry air followed by 40% humid air environment.

The sample depicted in FIG. 5 did not have an ALD $Al_2O_3$ layer contacting its surface. The SEM photo shows the substantial degradation of the sample containing an antireflective coating (AR) Cr layer and a thin Cr layer after irradiation.

Figure 6:
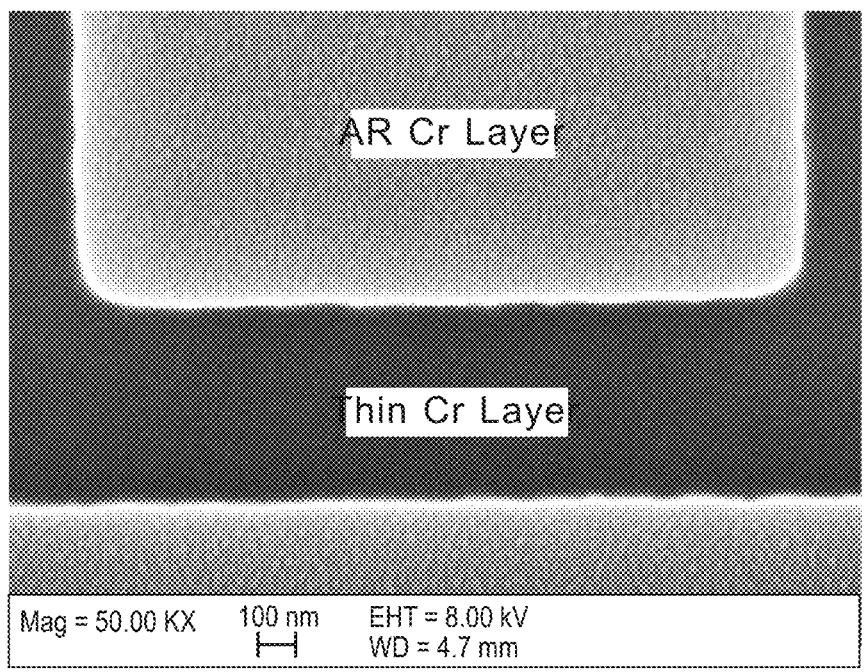
FIG. 6 is a SEM photo of COG with an ALD $Al_2O_3$ coating after irradiation.

FIG. 6 is a SEM photo of a COG sample that contains 5 nm of $Al_2O_3$ after irradiation. The SEM photos taken of the sample depicted in FIG. 2, shows no degradation of the surface of the sample as compared to the AR Cr layer and thin Cr layer.

Figure 7:
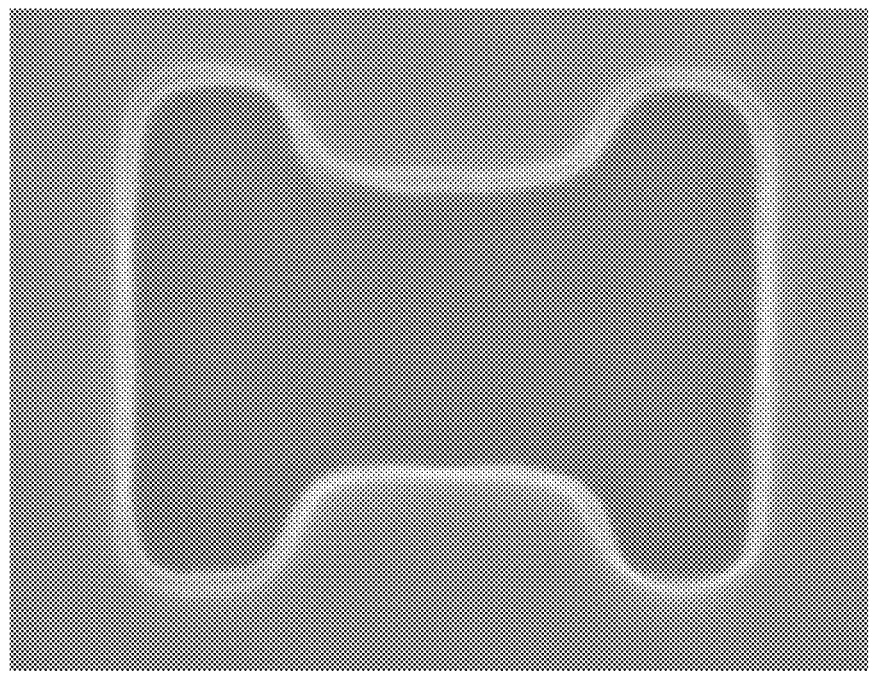
FIG. 7 is a SEM photo of OMOG with no ALD $Al_2O_3$ coating after irradiation.
Figure 8:
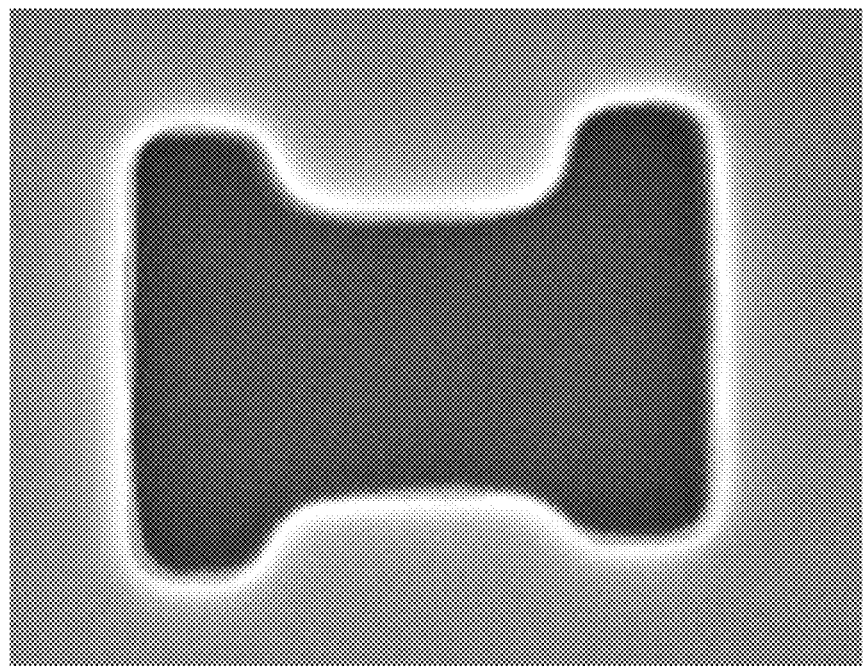
FIG. 8 is a SEM photo of OMOG with ALD $Al_2O_3$ coating after irradiation.

The OMOG samples of FIGS. 7 and 8 have an ALD deposited 5 nm $Al_2O_3$ film on their front side, and each was subject to irradiation at 193 nm in dry air and in 40% humid air environment.

FIG. 7 is a photo of a sample of OMOG containing no $Al_2O_3$ that shows significant change after irradiation.

FIG. 8 is a photo of an OMOG sample containing an ALD 5 nm $Al_2O_3$ coating depicting no CD change after irradiation at 193 nm.

In a variant of this process, the 5 nm ALD deposited $Al_2O_3$ coated sample of FIG. 2 was oxygen ashed, and immediately exposed to 193 nm irradiation concurrent with its exposure to an environment containing 40% humid air.

Figure 9:
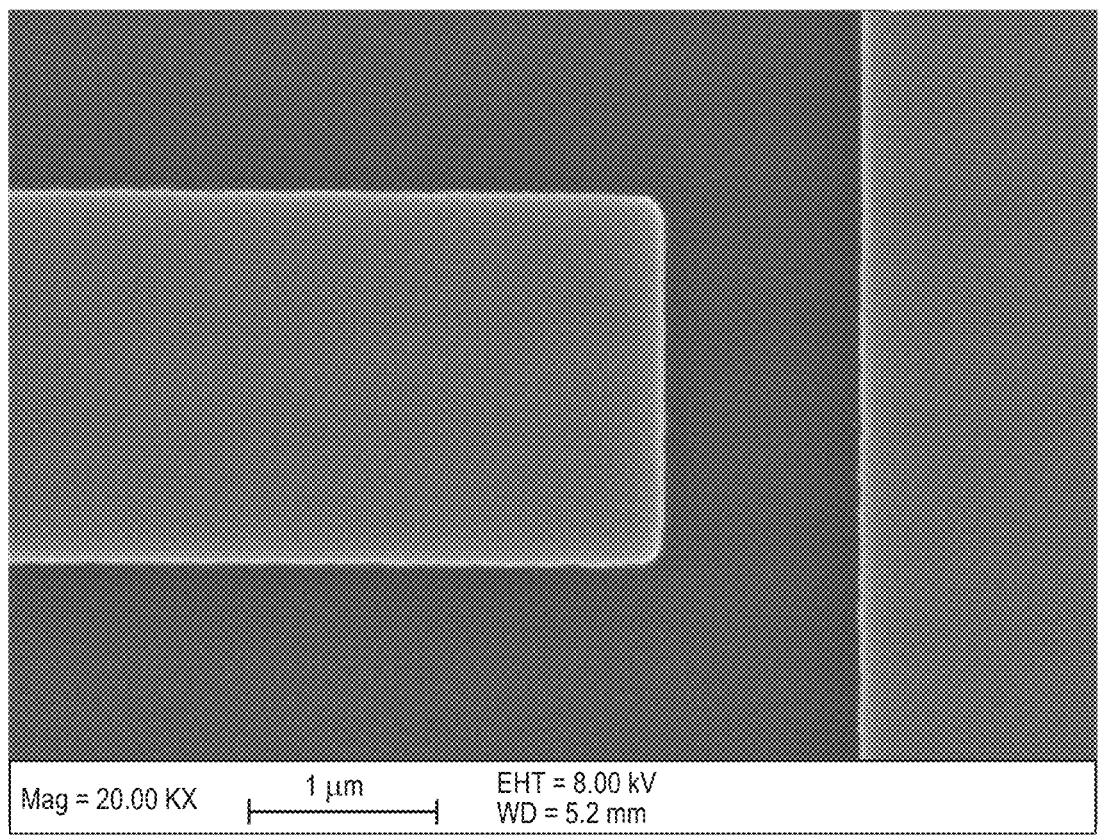
FIG. 9 is a SEM photo of a COG sample with 5 nm ALD $Al_2O_3$ coating oxygen ashed.

FIG. 9 is a SEM photo depicting a COG sample with an ALD deposited 5 nm $Al_2O_3$ coating. The sample was subjected to oxygen plasma ashing and immediately irradiated in a 40% humid air environment. The sample shows no evidence of any effect of irradiation after oxygen ashing. The SEM photo of FIG. 9, indicates that there is no evidence of any effect (CD change) of irradiation damage.

Figure 10:
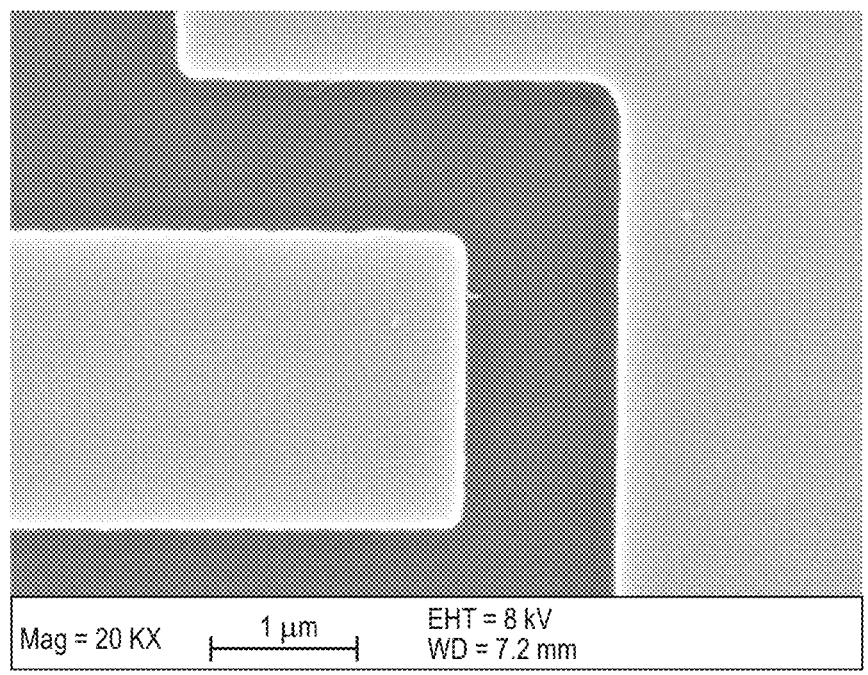
FIG. 10 is a SEM photo of a COG sample with a 1.1 nm ALD $Al_2O_3$ coating

FIG. 10 shows a SEM photo of a COG sample with a 1.1 nm $Al_2O_3$ coating that had been subjected to oxygen plasma ashing and immediately irradiated at 193 nm in humid air. The $Al_2O_3$ coating was applied by atomic layer deposition on patterned photomasks of the sample. The SEM photo of FIG. 10 shows there is barely a noticeable effect decorating feature edge.

Figure 11:
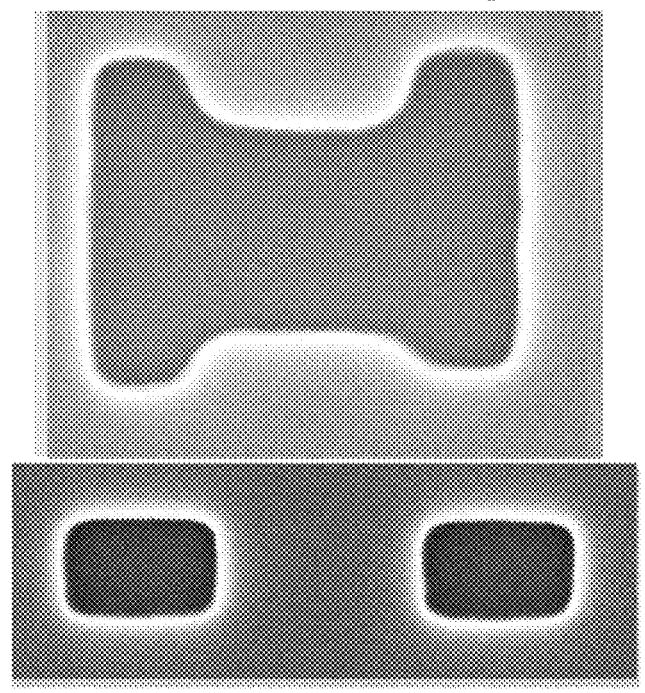
FIG. 11 is a SEM photo of OMOG sample with a 1.1 nm ALD $Al_2O_3$ coating showing overlaid images.

FIG. 11 contains SEM separate photos, the first of which is a top view of an OMOG 1.1 nm ALD deposited $Al_2O_3$ coated sample having a front side that was oxygen ashed followed by irradiation at 193 nm in humid air. irradiation. The SEM photo cross-sectional view at the bottom of FIG. 11, of the same sample shown in the top view. In FIG. 11, in each instance, the overlayered images of irradiated and unirradiated sites show no CD change.

Figure 12:
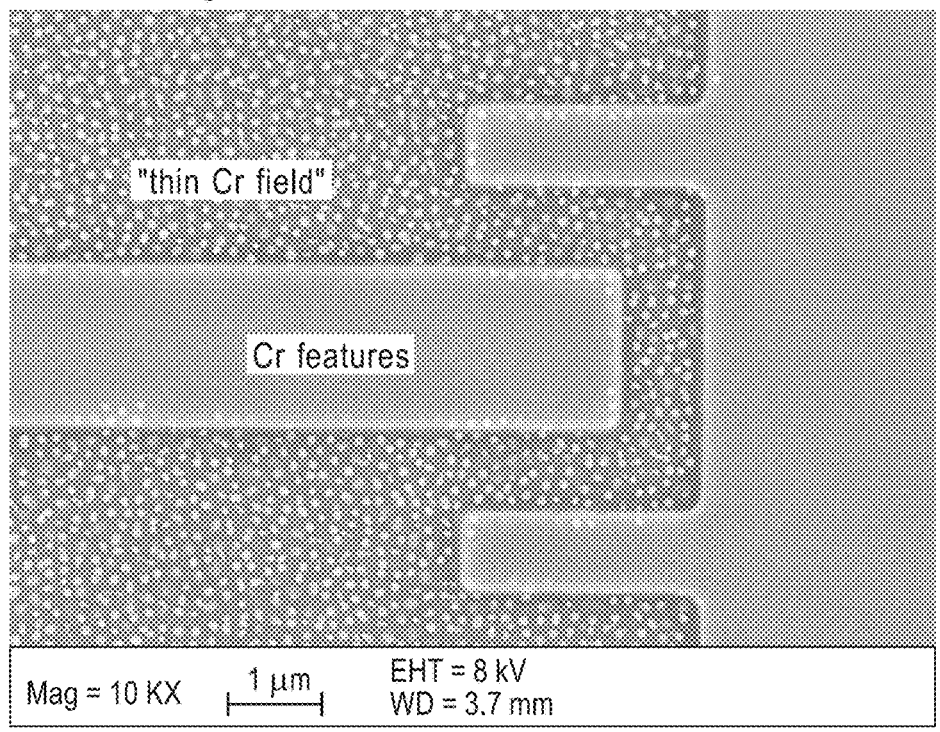
FIG. 12 is a SEM photo of COG sample with a 1.1 nm ALD $Al_2O_3$ coating showing thin chrome field images.

FIG. 12 is a SEM photo depicting a COG sample front side with a 1.1 $Al_2O_3$ coating that was exposed to 193 nm irradiation in a 40% humid air environment. The sample in FIG. 12 has two areas detailed as "thin Cr field" and "Cr features." The vigorous oxygen ash procedure may have opened up holes in the 1.1 nm $Al_2O_3$ film in the "thin Cr field." There is a small degradation effect at the edges of the Cr features, but no effects within the Cr features area.

The SEM photos were evaluated and the results comparing the optical transmission and reflectivity of bare fused silica were measured and compared with fused silica coated with 5 nm ALD $Al_2O_3$. There is a significant CD change in the $Al_2O_3$ without the ALD processing, and in the OMOG sample depicted in FIG. 8, the 5 nm ALD $Al_2O_3$ coating on its surface, as the SEM photo shows, there is no CD change after irradiation.

Using the same process described above for preparing samples containing a 5 nm ALD $Al_2O_3$ coating, samples containing 1.1 nm $Al_2O_3$ were subjected to oxygen plasma ashing and exposed immediately to 193 nm irradiation in 40% humid air irradiation. The SEM photos were taken that produced images of the 1.1 nm samples by scanning their respective surfaces. No CD change was noticed here, and the images were 'sharp' and clear and also all line definition was clear.

FIG. 12 is a SEM photo of a GOG sample having a 1.1 nm ALD deposited $Al_2O_3$ coating, The sample was $O_2$ ashed, followed by irradiation at 193 nm in humid air. The vigorous $O_2$ may have opened up the pinholes in the 1.1 nm $Al_2O_3$ film in the "thin Cr field." A small effect is noted at the edges of Cr features, but no effect within the Cr features was noticed. Over-layered images of irradiated and unirradiated sites on the sample show no critical dimension (CD) change.

Figure 13:
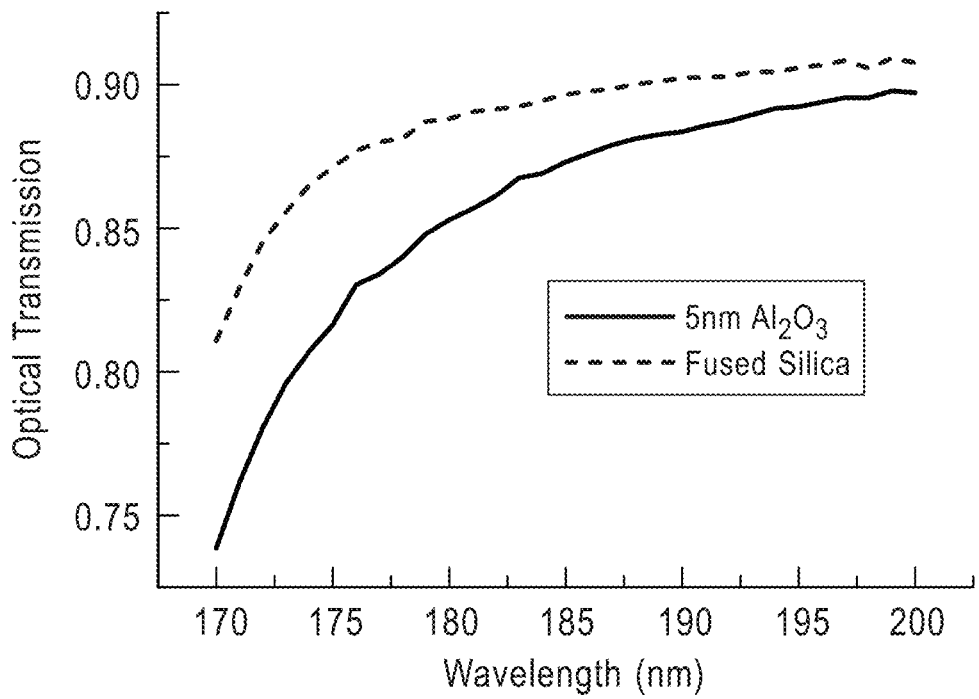
FIG. 13 is a graph depicting optical transmission, as a function of wavelength of fused silica with and without 5 nm of an ALD $Al_2O_3$ coating.

FIG. 13 is a graph depicting optical transmission and reflectivity vs. wavelength, as a function of wavelength of fused silica with and without 5 nm of an ALD $Al_2O_3$ coating.

Figure 14:
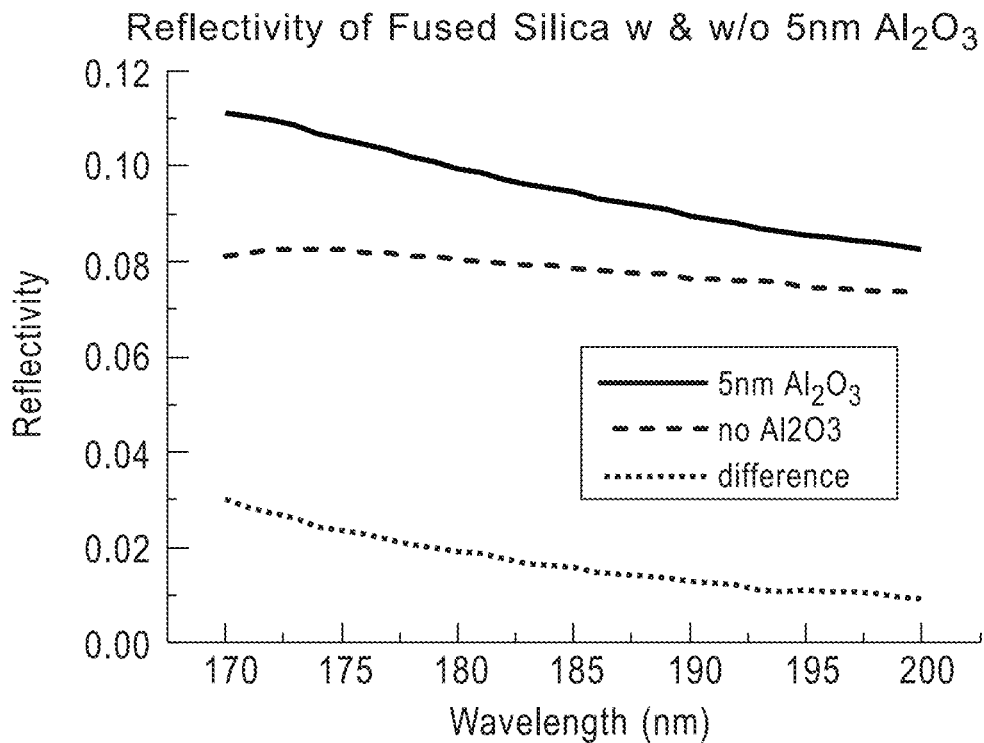
FIG. 14 is a graph plotting reflectivity as a function of wavelength of fused silica with and without 5 nm of an ALD $Al_2O_3$ coating film.

FIG. 14 is a graph depicting reflectivity as a function of wavelength of fused silica with and without 5 nm of an ALD $Al_2O_3$ coating.

Figure 15:
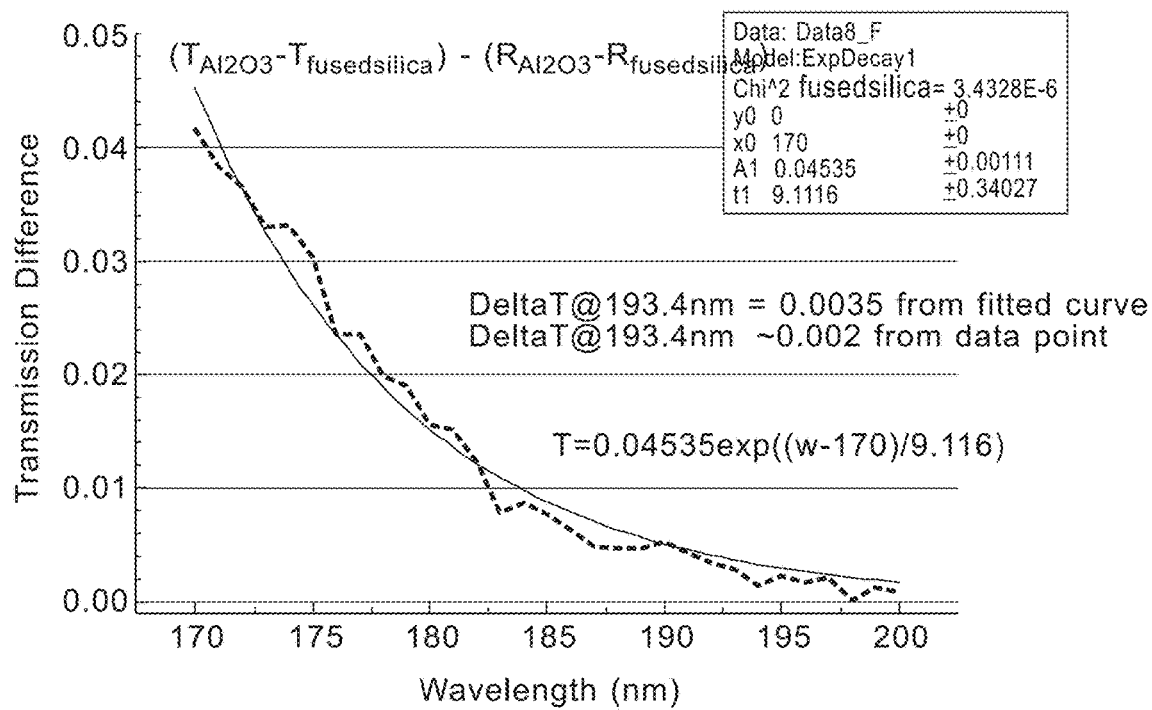
FIG. 15 is a graph plotting transmission difference as a function of wavelength of an $Al_2O_3$ coating on fused silica with and without 5 nm of an $Al_2O_3$ coating reflecting a $\Delta T$.

FIG. 15 is a graph depicting change in optical transmission due to 5 nm ALD $Al_2O_3$ coating on fused silica mask, i.e. plotting transmission difference corrected for reflectivity difference, as a function of wavelength of an ALD $Al_2O_3$ coating on said fused silica mask reflecting a ΔT.

ANALYSIS OF THE SEM PHOTOS

The samples with 5 nm ALD deposited $Al_2O_3$ coating showed no degradation as a result of being exposed to 193 nm irradiation; likewise, the samples containing the 1.1 nm ALD deposited $Al_2O_3$ coating showed no degradation as a result of being exposed to 193 nm irradiation.

An exception to the "no degradation result" was that with respect to the COG sample which was oxygen ashed after deposition and then irradiated, 1.1 nm ALD $Al_2O_3$ increased optical absorption at 193 nm by less than 0.003%.

In summary, an inspection of the SEM photos in FIGS. 5-12 and the data presented in FIGS. 13-15, supports the conclusion that the molybdenum silicide and chromium-based photomasks treated with an atomic layer deposition (ALD) $Al_2O_3$ coating do not degrade when exposed to 193 nm UV wavelength as compared with molybdenum silicide and chromium-based photomasks that do not have this ALD $Al_2O_3$ coating on their respective surfaces.

The deposition of a thin film of $Al_2O_3$ using atomic layer deposition protects both MoSi and Chrome on Glass photomasks from degradation.

The present invention contemplates implementation of the deposition of the ALD $Al_2O_3$ coating on said photomask using a system or systems that provide multi-processor, multi-tasking, multi-process, and/or multi-thread computing, as well as implementation on systems that provide only single processor, single thread computing.

Multi-processor computing involves performing computing using more than one processor. Multi-tasking computing involves performing computing using more than one operating system task.

A task is an operating system concept that refers to the combination of a program being executed and bookkeeping information used by the operating system. Whenever a program is executed, the operating system creates a new task for it.

The task is like an envelope for the program in that it identifies the program with a task number and attaches other bookkeeping information to it. Many operating systems, including Linux, UNIX®, OS/2®, and Windows®, are capable of running many tasks at the same time and are called multitasking operating systems.

Multi-tasking is the ability of an operating system to execute more than one executable at the same time. Each executable is running in its own address space, meaning that the executables have no way to share any of their memory. This has advantages, because it is impossible for any program to damage the execution of any of the other programs running on the system. However, the programs have no way to exchange any information except through the operating system (or by reading files stored on the file system).

Multi-process computing is similar to multi-tasking computing, as the terms task and process are often used interchangeably, although some operating systems make a distinction between the two.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium as mentioned above, can be a tangible photolithographic device that can retain and store instructions for use by an instruction execution device. The computer readable storage medium is an optical storage device, but may also be an electronic storage device, a magnetic storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers, and/or edge servers.

A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). m In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

These computer readable program instructions may be provided to a processor of a general-purpose computer, special purpose computer, or other programmable data processing apparatus to produce a machine, such that the instructions, which execute via the processor of the computer or other programmable data processing apparatus, create means for implementing the functions/acts specified in the description provided above.

The aforementioned computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

For example, two blocks shown in succession may, in fact, be executed substantially concurrently, or the blocks may sometimes be executed in the reverse order, depending upon the functionality involved.

Although specific embodiments of the present invention have been described, it will be understood by those of skill in the art that there are other embodiments that are equivalent to the described embodiments. Accordingly, it is to be understood that the invention is not to be limited by the specific illustrated embodiments, but only by the scope of the appended claims.

What we claim and desire to protect by Letters Patent is:

1. A method in a lithographic process comprising:
    depositing a film of $Al_2O_3$ on a photomask via an atomic layer deposition method (ALD);
    subjecting said film of ALD deposited $Al_2O_3$ on said photomask to a plasma treatment; and
    irradiating said film of ALD deposited $Al_2O_3$ on said photomask at a wavelength of 193 nm.

2. The method defined in claim 1, wherein said photomask is formed of one of chromium on glass (COG) and opaque molybdenum silicide on glass (OMOG).

3. The method defined in claim 2, wherein said plasma treatment is oxygen ashing.

4. The method defined in claim 3, wherein the thickness of said $Al_2O_3$ deposited via ALD on said photomask is between about 0.5 nm and 6 nm.

5. The method defined in claim 4, wherein said photomask is COG and said thickness of said $Al_2O_3$ deposited via ALD on said photomask is 5 nm thick.

6. The method defined in claim 5 wherein said 193 nm irradiation is conducted in a dry air environment.

7. The method defined in claim 5, wherein said 193 nm irradiation is conducted in a 40% humidity environment.

8. The method defined in claim 4, wherein said photomask is OMOG and said thickness of said $Al_2O_3$ deposited via ALD on said photomask is 1.1 nm thick.

9. The method defined in claim 8 wherein said 193 nm irradiation is conducted in a dry air environment.

10. The method defined in claim 8, wherein said 193 nm irradiation is conducted in a 40% humidity environment.

11. A computer program for depositing a film of $Al_2O_3$ on a photomask on a photomask via an atomic layer deposition method (ALD), said computer program product comprising:
    a computer readable storage medium having stored thereon:
    first program instructions executable by a processing circuit device to cause said device to deposit a film of $Al_2O_3$ on said photomask via an atomic layer deposition (ALD) method; and
    second program instructions executable by a processing circuit device to cause subjecting said photomask with said film of ALD $Al_2O_3$ thereon to a plasma treatment; and
    third program instructions executable by a processing circuit device to cause irradiation of said film of AID $Al_2O_3$ on said photomask at a wavelength of 1.93 nm.

12. The computer program product defined in claim 11, wherein said photomask is selected from the group of chromium on glass (COG) and opaque molybdenum silicide on glass (OMOG).

13. The computer program product defined in claim 12, wherein said plasma treatment is oxygen ashing.

14. The computer program product defined in claim 13, wherein said first program instructions cause said thickness of said ALD $Al_2O_3$ deposited on said photomask is between 0.5 nm and 6 nm.

15. The computer program product defined in claim 14, wherein said first program instructions cause said thickness of said $Al_2O_3$ deposited by said ALD process on said photomask to be 5 nm on COG and 1.1 nm on OMOG.

16. The computer program product defined in claim 15 wherein said 193 nm irradiation is conducted in a dry air environment.

17. The computer program product defined in claim 14 wherein said 193 nm irradiation is conducted in a 40% humidity environment.

18. A method in a lithographic process comprising:
    depositing a film of $Al_2O_3$ on a photomask via an atomic layer deposition method (ALD);
    subjecting said film of ALD deposited $Al_2O_3$ on said photomask to a plasma treatment; and
    irradiating said film of ALD deposited $Al_2O_3$ on said photomask at a wavelength of 193 nm,
    said photomask is formed of one of chromium on glass (COG) and opaque molybdenum silicide on glass (OMOG).

19. The method defined in claim 18, wherein said plasma treatment is oxygen ashing.

* * * * *